United States Patent [19]

Garcia

[11] Patent Number: 4,622,574
[45] Date of Patent: Nov. 11, 1986

[54] SEMICONDUCTOR CHIP WITH RECESSED BOND PADS

[75] Inventor: Enrique Garcia, Sandy Hook, Conn.

[73] Assignee: The Perkin-Elmer Corporation, Norwalk, Conn.

[21] Appl. No.: 759,728

[22] Filed: Jul. 29, 1985

[51] Int. Cl.⁴ ...................... H01L 29/06; H01L 21/08
[52] U.S. Cl. ........................................ 357/55; 357/56; 29/580; 29/583; 29/591; 428/209
[58] Field of Search .............. 428/209; 357/23.4, 23.7, 357/55, 56; 29/591, 580, 583

[56] References Cited

U.S. PATENT DOCUMENTS

| | | | |
|---|---|---|---|
| 4,142,925 | 3/1979 | King et al. | 148/175 |
| 4,523,368 | 6/1985 | Feist | 29/571 |
| 4,525,732 | 6/1985 | Bayraktaroglu | 357/13 |
| 4,547,789 | 10/1985 | Cannella et al. | 357/23.7 |
| 4,553,155 | 11/1985 | Chen et al. | 357/30 |

Primary Examiner—John E. Kittle
Assistant Examiner—Patrick Ryan
Attorney, Agent, or Firm—Thomas P. Murphy; Edwin T. Grimes; Francis L. Masselle

[57] ABSTRACT

A semiconductor chip having bond pads formed on a peripheral ledge recessed below the active chip surface. Ultrasonic wire bonds are made with the pads to lie below the active chip surface.

20 Claims, 3 Drawing Figures

$\theta = 54.74°$  $\ell = L - \dfrac{2t}{\tan \theta}$

SEMICONDUCTOR CHIP WITH RECESSED BOND PADS

FIELD OF THE INVENTION

This invention relates to semiconductor chips and, more particularly, to the fabrication of a semiconductor chip having recessed bond pads.

BACKGROUND OF THE INVENTION

In recent years, silicon integrated circuits have been utilized for new and diverse applications, such as pressure transducers, thermal print heads and ink jet nozzle arrays. Another significant use of silicon integrated circuits is in the area of electrostatic charge-sensing applications. The latter application typically requires the retaining of a small air gap (nominally 10 micrometers) between the photoreceptor (film) surface and the charge-sensing array or active chip surface.

Two features of significant impact on device fabrication are the large die size and the requirement that bonding wires do not interfere with the small sensor-to-film air gap. The former generally necessitates use of an electron beam system for mask making. The latter constrains or prohibits the use of conventional die bonding in which bond wires, typically 25 micrometers in diameter, lead up from the die surface to attach to the package pads.

Consequently, the hitherto approach was the use of so-called backside contacts. Backside contacts typically are made by thermomigration of molten alloy zones through the thickness of the wafer. With this technique, pipes of heavily aluminum-doped silicon are formed which are junction-isolated from the N-type substrate. This technique requires relatively high process temperatures, for example, 1100 degrees celsius, which is generally incompatible with silicon wafer fabrication. For a more thorough discussion of thermomigration reference may be had to the article titled "Random walk of liquid droplets migrating in silicon" by T. R. Anthony and H. E. Cline published in the Journal of Applied Physics, Volume 45, No. June 1976.

The present applicant observed that the use of the prior art so-called backside contacts resulted in numerous deficiencies and disadvantages such as the difficulty of forming the via(s) or holes about the periphery of the chip, the use of relatively high temperatures to effect the holes and the thermomigration, and the necessity to use N-type substrates when aluminum thermomigration is effected on a silicon wafer or chip.

The use of such relatively high process temperatures is generally incompatible with normal silicon wafer fabrication and can result in damage to the chip and its integrated circuitry. The (P-N) junction isolation, formed at the silicon wafer via(s) with aluminum thermomigration, limits or constrains the polarity of the externally applied voltage that can be utilized.

Some prior references of interest include U.S. Pat. No. 3,904,442 issued to T. R. Anthony and H. E. Cline; U.S. Pat. No. 3,902,925 issued to T. R. Anthony and H. E. Cline; U.S. Pat. No. 2,813,048 issued to W. G. Pfann; and U.S. Pat. No. 3,898,106 issued to H. E. Cline and T. R. Anthony.

These references are mentioned as being representative of the prior art and other pertinent references may exist. None of the above cited references are deemed to affect the patentability of the present claimed invention.

The present invention involves a silicon chip and method of fabrication thereof so as to afford a solution to the difficulties, disadvantages and problems encountered with the prior art. For example, in contrast to the prior art, the present invention provides a semiconductor chip having a peripheral ledge formed below the active chip surface. The bond pads are, therefore, recessed, which enables the wire bonds to lie below the active chip surface. The formation of the ledge(s) and bond pads may be effected without the use of relatively high temperatures. The surface of the chip or wafer is passivated, i.e., oxide coated, to substantially prevent any electrical (leakage) current flow between the bond pads. In this manner the prior art via(s) P-N junctions are eliminated, which obviates the limitations on the polarity of the voltages that can be externally applied to the silicon chips fabricated in accordance with applicants's invention.

SUMMARY OF THE INVENTION

A semiconductor chip structure, comprising:
an active chip surface portion (11) for containing an active circuit;
a bottom surface portion;
an intermediate surface portion (13,14) recessed below said active chip surface portion approximately between 50 micrometers and 150 micrometers;
a sloped wall portion (16,17);
bond pad means (23-27) provided on said intermediate surface portion; and
leadout line or trace means (18-22) for electrically connecting said bond pad means with said active circuit.

A method of fabricating a semiconductor chip to have one or more recessed bond pads from a silicon wafer, comprising the steps of:
forming a groove (31) in the silicon wafer (30) to define a ledge (34) recessed approximately 125 micrometers below the top surface portion (11) of the semiconductor chip;
forming an aluminum bond pad (23) on said ledge (34) and forming an aluminum trace (18) which extends from a portion of the top surface portion of the semiconductor chip to said bond pad; and
cutting the silicon wafer (30) to define a discrete semiconductor chip (10) having a recessed bond pad (18).

Accordingly, it is an object of the present invention to provide a new and improved semiconductor chip.

It is a further object of the present invention to provide a novel semiconductor chip structure.

It is a further object of the present invention to provide a novel chip bond pad location for a semiconductor chip.

It is a further object of the present invention to provide a new and improved means for effecting wire bonding with a semiconductor chip.

It is a further object of the present invention to provide a new and improved method of fabricating a semiconductor chip.

It is a further object of the present invention to provide a silicon semiconductor type circuit chip having bond pads provided between the active circuitry and the backside of the chip.

It is a further object of the present invention to provide a semiconductor chip with recessed bond pads.

It is a further object of the present invention to provide a semiconductor chip having a peripheral bond pad mounting ledge recessed approximately fifty micrometers or more below the active chip surface.

BRIEF DESCRIPTION OF THE DRAWINGS

Other objects and advantages of the present invention will be evident from the following detailed description when read in conjunction with the accompanying drawings which illustrate the preferred embodiment of the present invention. Similar reference numerals refer to similar parts throughout.

DESCRIPTION OF THE PREFERRED EMBODIMENT

Figure 1:
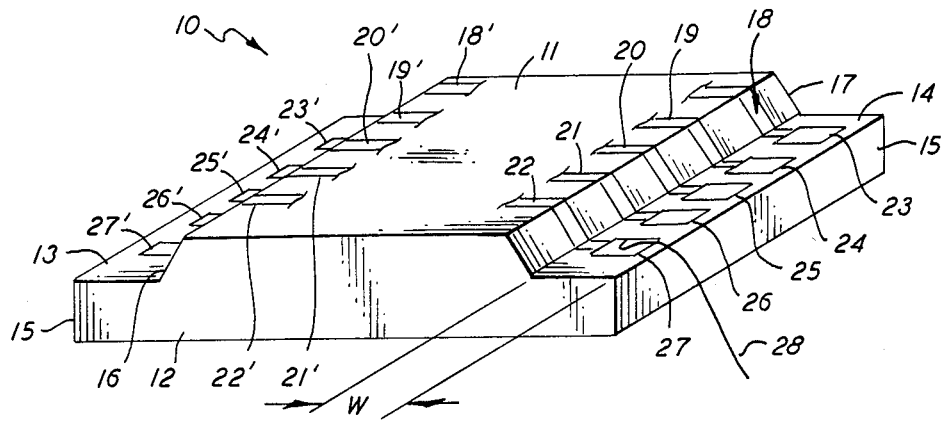
FIG. 1 is a perspective plan view of a semiconductor chip having a configuration in accordance with the present invention and being wire bonded to the chip carrier.

Reference will now be made to the drawings and, in particular, to FIG. 1 which shows a silicon chip 10 having a structure and configuration in accordance with the present invention.

silicon chip 10 may be fabricated from a silicon wafer as will be described in more detail hereinafter.

Silicon chip 10 basically comprises an active chip surface 11, a bottom surface (not shown) side walls 12 (only one shown), one or more bond pad ledges 13 and 14, end walls 15, and one or more sloped walls 16 and 17. A plurality of leadout lines or traces 18–22, 18′–22′ are provided, which function to electrically connect the chip's active circuitry to a plurality of bond pads 23–27, 23′–27′, respectively.

Bond pad ledges 13 and 14 are each recessed below the active chip surface 11 a predetermined distance to enable bond wires, for example, wire 28, to be bonded to a respective bond pad, for example, bond pad 27, while lying below the plane of active chip surface 11. In accordance with the preferred embodiment of the invention, the plane of bond pad ledges 13 and 14 are each recessed approximately 125 micrometers below active chip surface 11. Bond pad ledges 13 and 14 are generally parallel with and have a plane intermediate active chip surface 11 and the chip's bottom surface. Bond pad ledges 13 and 14 are dimensioned to accommodate bond pads 23–27, 23′–27′, respectively, which are dimensioned to facilitate wire bonding thereto.

Sloped walls 16 and 17 extend between the active chip surface 11 and a recessed bond pad ledge 13 and 14, respectively. The angle of inclination of sloped walls 16 and 17 may be selected to facilitate the formation of the leadout lines by conventional means. Sloped walls 16 and 17 each have an angle of inclination of approximately 54.74 degrees, which is formed by means of an anistropic etch process along the wafer die boundaries.

The leadout lines or metal traces 18–22, 18′–22′ may be formed by photolithography. One technique is to use a metal shadow mask (not shown) having windows througn which aluminum may be deposited to form the leadout lines and bond pads. A second technique uses a dry film photoresist applied in sheet form to the silicon wafer.

As noted above, V-groove(s) 31 may be effected by preferential anisotropic etching along the die scribe lines of silicon wafer 30. Each V-groove 31 is formed to a depth of approximately between 50 micrometers and 150 micrometers. Sloped walls 32 and 33 each have an angle of incline of approximately 54.74 degrees with respect to the plane of active chip surface 11 and subsurface ledge 34. The distance L between upper ridges 35 and 36, and the length l of subsurface ledge 34 are predetermined to provide a predetermined ledge width W (see FIG. 1) to enable formation of the bond pads thereon. The above dimensions may be appreciated more fully from the relationship $l = L - 2t/\tan\theta$.

Figure 2:
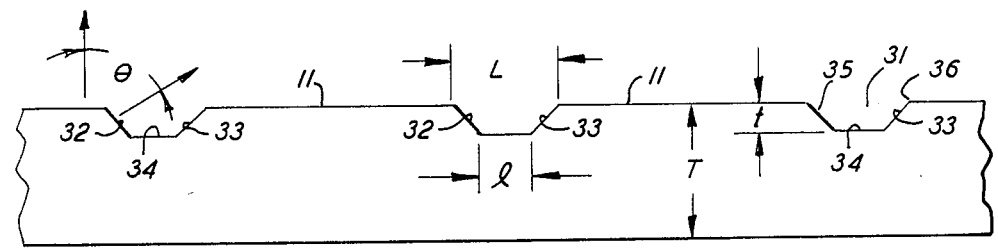
FIG. 2 is a side view, partly cutaway, of a silicon wafer having grooves or troughs formed therein in accordance with a feature of the present invention.
Figure 3:
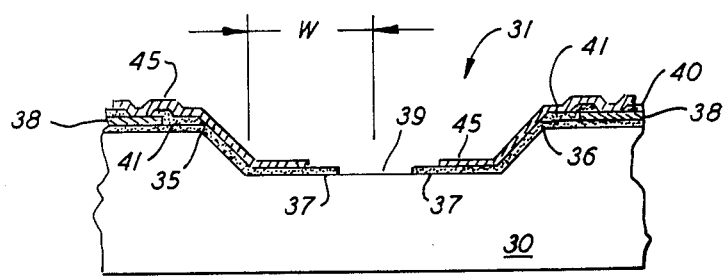
FIG. 3 is a cross-sectional view, partly cutaway, of a silicon wafer having recessed bond pads in accordance with the invention.

The method of fabricating a silicon chip 10 from a silicon wafer 30 will now be described with particular reference to FIGS. 2 and 3.

Generally speaking, the method of forming semiconductor chip 10 with recessed bond pads in accordance with the invention, comprises the steps of:

(I) forming one or more V-grooves 31 in a silicon wafer 30;

(II) forming metal traces 18–22, 18′–22′ and bond pads 23–27, 23′–27′; and (III) dicing or cutting silicon wafer 30 along saw alley 39 to effect one or more discrete semiconductor chips 10 having recessed bond pads to facilitate wire bonding at a recessed surface 13,14 below the active chip surface 11.

The detailed method or procedure involved in forming the V-grooves 31 may include the following steps:

(a) coating a silicon wafer with a layer of photoresist material and baking to form a protective photoresist layer over the wafer;

(b) aligning a V-groove mask (not shown) with the wafer and exposing to ultraviolet light to soften the photoresist material within the mask exposed V-groove window(s);

(c) removing the V-groove mask;

(d) developing or removing the photoresist material layer from the mask defined V-groove window(s);

(e) etch removing any silicon dioxide layer on the wafer from the defined V-groove window(s);

(f) coating wafer 30 with a layer of negative photoresist material;

(g) aligning the V-groove mask with the wafer and exposing to ultraviolet light to soften the photoresist material within the mask exposed V-groove window(s);

(h) removing the V-groove mask;

(i) developing the photoresist material layer from the exposed V-groove window(s);

(j) baking the wafer to harden the photoresist coating about the remaining surface of the wafer;

(k) etching the unprotected/uncoated V-groove area(s), for example, with potassium hydroxide at 55 degrees celsius for approximately two hours;

(l) stripping the protective layer of photoresist material from the wafer;

(m) removing any unwanted silicon dioxide overhang ledge or projections (not shown) from upper ridges 35 and 36; and (n) depositing a layer of passivation oxide 37 about the wafer.

The detailed method of forming the metal traces and bond pads may include the steps of:

(a) selective sputter etching a first previously provided layer 38 of aluminum to form selective connection(s) with the chip's active circuitry;

(b) sputter deposit a second layer 45 of aluminum over the previously provided silicon dioxide or passivation oxide coated regions 37, 40 and 41;

(c) applying a coating of dry film photoresist material;

(d) align a mask (not shown) to define the trace, bond pad and saw alley regions on the wafer, and expose to ultraviolet light;

(e) develop the ultraviolet light exposed regions;

(f) plasma-etch the second layer 45 of aluminum to form the traces and bond pads; and (g) strip the coating of dry film photoresist material from silicon wafer 30.

It is to be understood that the above described embodiment is illustrative of the application of the principles of the present invention. Other arrangements and applications may be devised by those skilled in the art without departing from the spirit and scope of the claimed invention.

I claim:

1. A semiconductor chip having a top surface portion containing active circuitry, wherein the improvement comprises:

a peripheral ledge portion being recessed between 50 micrometers and 150 micrometers below the top surface portion of the chip;

a sloped wall portion intermediate said top portion of the chip and said peripheral ledge portion;

at least one bond pad means provided on said peripheral ledge portion; and leadout line means for electrically connecting the active circuitry with said bond pad.

2. A semiconductor chip as in claim 1, wherein:
the bond pad means is formed of aluminum and being dimensioned to facilitate wire bonding thereto.

3. A semiconductor chip as in claim 1, wherein:
the leadout line means being formed of aluminum.

4. A semiconductor chip as in claim 1, wherein:
the semiconductor chip is formed of a silicon material to have a generally rectangular configuration with two spaced peripheral recessed ledge portions each extending across a respective edge portion of the semiconductor chip.

5. A semiconductor chip as in claim 1, including:
a sloped wall portion integrally formed with said peripheral ledge portion, said sloped wall portion extending between the top surface portion containing the active circuitry and said peripheral ledge portion.

6. A semiconductor chip as in claim 5, wherein:
the sloped wall portion has an angle of inclination of approximately 54 degrees.

7. A semiconductor chip as in claim 5, wherein:
the leadout line means being provided on a portion of said sloped wall portion.

8. A silicon type semiconductor chip, comprising:
an active chip surface portion (11) containing active circuitry;

a pair of bond pad ledges (13, 14) each recessed below said active chip surface portion a predetermined distance and being substantially parallel with said active chip surface portion;

a pair of sloped wall portions (16, 17) each being intermediate said active chip surface portion and a respective one of said pair of bond pad ledges;

a first plurality of aluminum bond pad means (23 through 27) formed on one of said pair of bond pad ledges (14);

a first plurality of aluminum leadout line means (18 through 22) each being connected to a respective one of said first plurality of bond pad means and each disposed below said active chip surface;

a second plurality of aluminum bond pad means (23' through 27') formed on the other of said pair of bond pad ledges (13); and a second plurality of aluminum leadout line means (18' through 22') each being connected to a respective one of said second plurality of bond pad means and each disposed below said active chip surface.

9. A semiconductor chip as in claim 8, wherein:
the pair of bond pad ledges are each recessed below the active chip surface portion approximately 125 micrometers to form a pair of relatively thin end wall portions (15).

10. A method of fabricating a semiconductor chip wafer, comprising the steps of:

forming one or more V-grooves (31) in the silicon wafer (30) by etching along the die scribe lines of the silicon wafer to define a pair of sloped walls (32,33) and a subsurface ledge (34);

forming one or more leadout lines (18-22,18'-22') and one or more corresponding bond pads (23-27,23'-27'), said leadout lines being formed to define traces each of which extends from a portion of a top surface (11) of the silicon wafer and on a respective one of said pair of sloped walls (32,33) and to a respective bond pad; and dicing the silicon wafer at one or more saw alley 39 to define one or more discrete semiconductor chips (10) having recessed bond pads.

11. A method of fabricating a semiconductor chip to have one or more recessed bond pads from a silicon wafer, comprising the steps of:

forming a groove (31) in the silicon wafer (30) to define a ledge (34) recessed approximately 125 micrometers below the top surface portion (11) of the semiconductor chip;

forming an aluminum bond pad (23) on said ledge (34);

forming an aluminum trace (18) which extends from a portion of the top surface portion of the semiconductor chip to said bond pad; and cutting the silicon wafer (30) to define a discrete semiconductor chip (10) having a recessed bond pad (18).

12. An electrostatic charge-sensing apparatus comprising:

a semiconductor chip having a top surface portion containing active circuitry comprising a peripheral ledge portion being recessed a predetermined distance below the top surface portion of the chip, at least one bond pad means provided on said recessed ledge portion, and leadout line means for electrically connecting the active circuitry with said bond pad; and a photoreceptor surface disposed in substantially parallel spaced relation from said top surface portion defining a gap therebetween.

13. An electrostatic charge-sensing apparatus as in claim 12 wherein the gap is nominally 10 micrometers.

14. A semiconductor chip as in claim 12, wherein:
the peripheral ledge portion being recessed between 50 micrometers and 150 micrometers below the top surface portion of the semiconductor chip.

15. A semiconductor chip as in claim 12, wherein:
the bond pad means is formed of aluminum and being dimensioned to facilitate wire bonding thereto.

16. A semiconductor chip as in claim 12, wherein:

the leadout line means being formed of aluminum.

17. A semiconductor chip as in claim 12, wherein:
the semiconductor chip is formed of a silicon material to have a generally rectangular configuration with two spaced peripheral recessed ledge portions each extending across a respective edge portion of the semiconductor chip.

18. A semiconductor chip as in claim 12, including:
a sloped wall portion integrally formed with said peripheral ledge portion, said sloped wall portion extending between the top surface portion containing the active circuitry and said peripheral ledge portion.

19. A semiconductor chip as in claim 18 wherein:
the sloped wall portion has an angle of inclination of approximately 54 degrees.

20. A semiconductor chip as in claim 18 wherein:
the leadout line means being provided on a portion of said sloped wall portion.

* * * * *